(12) United States Patent
DiMaria

(10) Patent No.: US 6,622,603 B1
(45) Date of Patent: *Sep. 23, 2003

(54) LINEAR VIA PUNCH

(75) Inventor: Ferdinand D. DiMaria, Wappingers Falls, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/820,396

(22) Filed: Mar. 12, 1997

(51) Int. Cl.$^7$ .............................. B26D 7/02; B26D 7/26; B26F 1/02
(52) U.S. Cl. ............................. 83/452; 83/553; 83/588; 83/620; 83/637; 83/687; 83/929.1
(58) Field of Search .................... 83/553, 620, 637, 83/687, 588, 618, 685, 691, 452, 929.1; 234/43, 42, 44, 45, 111–116

(56) References Cited

U.S. PATENT DOCUMENTS

| | | | | |
|---|---|---|---|---|
| 173,062 A | * | 2/1876 | Robertson et al. | 83/588 X |
| 912,142 A | * | 2/1909 | Livermore | 83/553 |
| 915,042 A | * | 3/1909 | Robinson | 83/620 X |
| 1,726,219 A | * | 8/1929 | Gammeter | 83/618 X |
| 1,742,216 A | * | 1/1930 | Rauber | 83/588 X |
| 1,964,752 A | * | 7/1934 | Wales | 83/588 |
| 2,281,439 A | * | 4/1942 | Heftler | 83/620 X |
| 2,379,271 A | * | 6/1945 | Bechtel | 83/637 |
| 2,707,922 A | * | 5/1955 | Ferguson et al. | 83/691 X |
| 2,827,963 A | * | 3/1958 | Anders | 234/60 |
| 2,906,335 A | * | 9/1959 | Love | 83/618 X |
| 3,161,099 A | * | 12/1964 | Comet | 83/588 X |
| 3,228,275 A | * | 1/1966 | Taber | 83/588 |
| 3,320,843 A | * | 5/1967 | Schott, Jr. | 83/691 X |
| 3,334,809 A | | 8/1967 | Zajic et al. | 234/106 |
| 3,523,474 A | | 8/1970 | Kinslow, Jr. | 83/40 |
| 3,608,413 A | * | 9/1971 | Borello | 83/687 X |
| 4,596,359 A | | 6/1986 | Nordli | 234/107 |
| 4,696,210 A | * | 9/1987 | Cain et al. | 83/33 |
| 4,821,614 A | | 4/1989 | Fleet et al. | 83/100 |
| 4,872,381 A | | 10/1989 | Stroms | 83/76.1 |
| 5,140,879 A | | 8/1992 | Haj-Ali-Ahmadi et al. | 83/39 |
| 5,193,426 A | * | 3/1993 | Dunn | 83/553 X |
| 5,463,922 A | * | 11/1995 | Mori | 83/588 X |
| 5,836,226 A | * | 11/1998 | Tsuji et al. | 83/451 X |

OTHER PUBLICATIONS

Long et al., "FlexPunch Machine", IBM Technical Disclosure Bulletin, vol. 31, No. 9, pps. 140–141, Feb. 1989.

Cochran et al., "Automated Punch Apparatus For Forming Via Holes In A Ceramic Green Sheet", IBM Technical Disclosure Bulletin, vol. 20, No. 4, pps. 1379–1380, Sep. 1977.

Coneski et al., "Punch Programming Mechanism", IBM Technical Disclosure Bulletin, vol. 26, No. 10A, pps. 5100–5102, Mar. 1984.

Long et al., "Oscillating Punching Mechanism", IBM Technical Disclosure Bulletin, vol. 30., No. 6, pps. 355–358, Nov. 1987.

U.S. Patent Application Ser. No. 08/660,611, by Ferdinand D. DiMaria, entitled Precision Punch and Die Design and Construction, filed Jun. 6, 1996.

* cited by examiner

Primary Examiner—Clark F. Dexter
(74) Attorney, Agent, or Firm—DeLio & Peterson LLC; Robert Curcio; Margaret A. Pepper

(57) ABSTRACT

A method and apparatus for punching holes in a substrate which is disposed between a punch head with a fixed partial pattern of holes and a die having a full array pattern of holes. The punch head punches holes in the substrate by aligning with the die and contacting the substrate. Punches contained in the punch head articulate in at least one of x, y, and theta positions in order to precisely align with holes in the die thereby producing holes in the substrate which precisely match holes in the die.

4 Claims, 3 Drawing Sheets

LINEAR VIA PUNCH

FIELD OF THE INVENTION

The present invention generally relates to the formation of holes in a substrate material, typically an unfired, ceramic "greensheet," for the purpose of fabricating electronic circuit components which are ultimately used in the manufacture of electronic devices such as computers or the like.

BACKGROUND OF THE INVENTION

Circuit boards with multiple VLSI circuit chips are called Multichip Modules (MCM). The use of VLSI circuits presents interface problems relating to the interconnection of the integrated circuits to other circuits and the placement of the integrated circuits on a ceramic circuit board (MCM-C). As VLSI technology has advanced, the density of circuits on a single VLSI chip has increased and the necessary interconnection for VLSI chips has become increasingly difficult to achieve in a limited space. An MCM-C design object is to increase the ratio of the total area occupied by silicon to the total board area, called silicon efficiency ratio. The MCM-C packaging limits the speed and size of a system. Because the physical interconnection is a limiting design factor, a way to accommodate more circuit interconnections is necessary.

In a typical configuration, semiconductor chips are mounted in cavities on multilayer circuit boards and the circuit boards accommodate intercircuit connections through tiny vertical holes or vias between the layers. The chips are connected to the vias using a controlled-collapsed-chip-connection technique called C-4. The vias are filled with a conductive material, such as molybdenum paste, which creates a connection to the VLSI circuit. The size of the holes dictates the size of the connection and the number of connections that can be placed on the multilayer circuit board.

There are a number of methods for creating small holes in precision tooling to facilitate the punching of vias. Such methods include dry or laser cutting and electrical discharge machining (EDM). The precision tooling of each of these methods facilitates the punching of vias as small as 0.01778 cm (0.007 in.) in dielectric material as thin as 0.00762 cm (0.003 in.). The precision tooling is used in a master punch and die assembly.

In the precision punching method, each precision via hole is punched in a workplace or substrate using precision tooling which includes a precision punch assembly and a precision die assembly. The punches of the precision tooling device are guided by precision holes in one or more precision plates. The cutting edge of the die plate is formed by precision openings in the die plate. The precision of the tooling is the limiting factor in providing a precision punch substrate. Prior art is directed to the precision necessary to create the smallest possible precision holes in a substrate.

The vias necessary to create the circuit interconnection have previously been created by a punch and die device which is fabricated by making a die mask or plate using EDM. The plate is fabricated from 0.127 cm (0.050 in.) tool steel. Precision holes as small as 0.1651 cm (0.0065 in.) are burned through two plates at one time by EDM at a rate of 6 holes per hour. The plates are then used in a precision tooling device. The size of the substrate hole punched by the precision tooling is limited by the size of the smallest plate opening which can be created by EDM, namely 0.01651 cm (0.0065 in.). The EDM plate facilitates punching holes with an accuracy of 0.00762 cm (0.003 in.) true position. These tool steel plates are heavy, expensive, and require sharpening. The sharpening consumes time and can only be done several times before the die must be replaced due to wear.

A method for producing precision dies is disclosed in co-pending U.S. patent application Ser. No. 08/660,611 filed Jun. 6, 1996 and titled "Precision Punch and Die and Construction." The copending application is incorporated herein by reference.

Numerous types of punching devices are found in the prior art. For example, U.S. Pat. No. 4,821,614 describes a punch apparatus with a single punch element and a programmable apparatus to selectively move a carriage which supports the sheet of material being punched. Another punch apparatus with a single element is described in U.S. Pat. No. 4,872,381. IBM Technical Disclosure Bulletin, Vol. 20, No. 4, September 1977, pages 1379–80, discusses a punch apparatus with a plurality of individually activated, programmable, punching elements. The substrate to be punched is supported by a movable table. IBM TDB, Vol. 26, No. 10A, March, 1984, pages 5100–02, describes a mechanical punch with a dense array of punches which is electromechanically affixed to a platen which is driven downward at the appropriate time causing a push rod and punch carrier to be driven down. Simultaneously, a punch is driven down, thereby piercing the substrate material. IBM TDB, Vol. 30, No. 6, November, 1987, pages 355–58, describes a punching apparatus in which a single punch is used to form vias in the substrate by performing punching with the substrate moving at a constant velocity ("on the fly"). IBM TDB, Vol. 31, No. 9, February, 1989, pages 140–41, discusses a flexpunch machine which uses a punch and die assembly to produce the entire via pattern in the substrate. The punch and die assembly moves at a constant rate while punching the substrate.

Another conventional alternative to a single punch machine is to have an array of equally spaced punches mounted on a bar spanning the width of the substrate being punched and perpendicular to the direction of the movement of the substrate. With this arrangement, the substrate is moved in the direction of the Y-axis and the punches are fired simultaneously as needed. If the spacing of the punches exceeds the grid size of the holes, and if the ratio of grid size to punch spacing is an integer, then the number of passes of the substrate required to complete the punching task is equal to this ratio. For each pass of the substrate, the material is indexed one grid unit along the X-axis and a discrete indexing device for incremental movement of the substrate along the X-axis is required. Further, due to physical size requirements and electric power usage, the simultaneous firing of the punches on the array requires an independent power supply for each punch. The drawbacks of this system include the power supply problems and the requirement that a discrete indexing device, movable in the X direction, be provided.

None of the aforementioned references utilize a punch head having a fixed partial via pattern corresponding to a line of ups which is created from a via fill mask, to perforate a substrate which is supported by a precision die which is also created from the via fill mask having a full array pattern of vias. A problem exists with punching a constantly moving substrate because the punch speed must be extremely high with respect to the substrate speed in order to avoid any distortion such as ripping, tearing, or the like. Conventional systems which punch "on the fly" must use an extremely large power supply to obtain the necessary punch speed relative to the substrate speed. The need for a large power supply for each punch in an array is impractical because large power supplies have correspondingly large physical size and electric power requirements which limit their use to a single punch or a die set having several plural punches affixed to it.

A conventional system includes cluster punches and cluster dies which are used to punch vias with both being moved together about the surface of the substrate punching a single pattern of holes (ups) multiple times, as required, in the substrate. An illustration of such a prior art system is shown in FIG. 5. In FIG. 5 punch and die assembly 62 is positioned to sandwich greensheet 60. A single pattern is punched in one operation. Also illustrated are positioning system 92, hole verifier 94, and controller 96. The drawback in this system is that the punch and die assembly is subject to alignment errors with respect to the substrate and that, as the number of holes required per ups increases, the precision of the final via pattern decreases. This type of system is typically cost effective only if the total number of vias is less than approximately 3,000.

In another conventional system, the entire hole pattern of a substrate is created in one operation. In this system, a gang punch and die is used to create the via pattern. This system is undesirable because, as the number of vias increases, the cost to create a single large punch becomes prohibitive. Technological demands now require substrates to have greater than 10,000 holes per surface and the cost to create a single punch to provide so many holes becomes unjustifiable in view of consumer demand for lower product cost. Another drawback is that the potential for punch breakage is great and the resulting repair cost is high.

Another conventional system uses a plurality of single punches to produce an entire via hole pattern in a substrate instead of using a gang punch. This system is illustrated in FIG. 6, which shows apparatus 70 which has a plurality of individually activated programmable punching elements 72, supported in punch head 74. Base 76 moves table 78, which supports substrate 80, in the X and Y directions. As substrate 80 is positioned under punching elements 72, computer control unit 82 activates punching elements 72 as required. This system has the disadvantages of requiring complicated programming and the punching operation is time consuming because only one punch is activated at a time.

Bearing in mind the problems and deficiencies of the prior art, it is therefore an object of the present invention to provide a linear punch fabricated using mask technology that will have a partial linear pattern of ups for punching a substrate in conjunction with a die which contains a full pattern of ups. It is another object of the present invention to provide a precision punch which has a lower cost to construct. It is yet another object of the present invention to provide a precision punch which aligns with the die before punching the substrate. It is a further object of the present invention to provide a precision punch which will compensate for misregistration of the punch with respect to the die. It is another object of the present invention to provide a precision punch which punches holes of various size. Still another object of the present invention is to provide a precision punch which is less susceptible to breakage.

SUMMARY OF THE INVENTION

To solve these aforementioned disadvantages of conventional punch assemblies, and to provide accuracy and repeatability in the creation of vias, the present invention relates to a linear via punch employing a fixed partial pattern of punches to create holes in a substrate by mating with a die which has a full array pattern of holes and is adapted to support a substrate where the substrate is disposed between the punch head and the die so that the punch head punches holes in the substrate and matches corresponding holes in the die.

The present invention also relates to a method for punching and filling vias in a substrate comprising the steps of fabricating a die pattern corresponding to a via fill mask and placing the substrate on the die, positioning the substrate and the die at a position below the punch head, punching vias in the substrate corresponding to a partial pattern of the die, removing the punch from the substrate, and repositioning the punch relative to the substrate to a further position to punch further holes in the substrate.

The present invention further relates to a linear via punch which articulates in at least one of an X position, Y position, and theta position with respect to the die to compensate for die/punch misregistration.

The present invention also relates to a method for punching and filling vias in a substrate comprising the steps of fabricating a die pattern corresponding to a via film mask, placing the substrate on the die, detachably fixing the substrate to the die, positioning the substrate and the die at a position below the punch head, aligning the substrate and the die with the punch head, placing the punch head in contact with the top surface of the substrate, articulating the punch head in at least one of an X position, a Y position, and a theta position with respect to the die, punching at least one via in the substrate corresponding to the die pattern of the die, stepping the substrate and the die to a further position below the punch head, and repeating the punching steps until the die pattern is complete.

The present invention further relates to a linear via punch where the substrate is a greensheet and also relates to a linear via punch where the substrate is a flexible plastic film with a metal coating, such as Kapton®.

The present invention finally relates to a linear via punch for punching holes in a substrate comprising a punch head having a fixed partial pattern, a die having a full array pattern with a portion corresponding to the fixed partial pattern and adapted to support the substrate wherein the substrate is disposed between the punch head and the die such that the punch head is above the substrate and the punch head punches holes in the substrate in a pattern which corresponds to the die array pattern, and alignment means for aligning the punch head with the die, the alignment means having at least one alignment pin on the punch head and at least one locator hole in the die, wherein the punch head articulates in at least one of an X position, Y position, and theta position with respect to the die.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE PREFERRED EMBODIMENTS

In the manufacture of multilayer ceramic (MLC) substrates for integrated circuit semiconductor package structures, a plurality of ceramic greensheets must be punched to form via holes, metalizing paste (fill) deposited in the holes and in appropriate patterns on the surface of the sheet, the sheets stacked and subsequently fired at a sintering temperature. The holes are conventionally formed with a punch. In the typical MLC product, ceramic sheets can have thousands of holes each with a diameter as small as 0.01016 cm. (0.004 in.).

Figure 1:
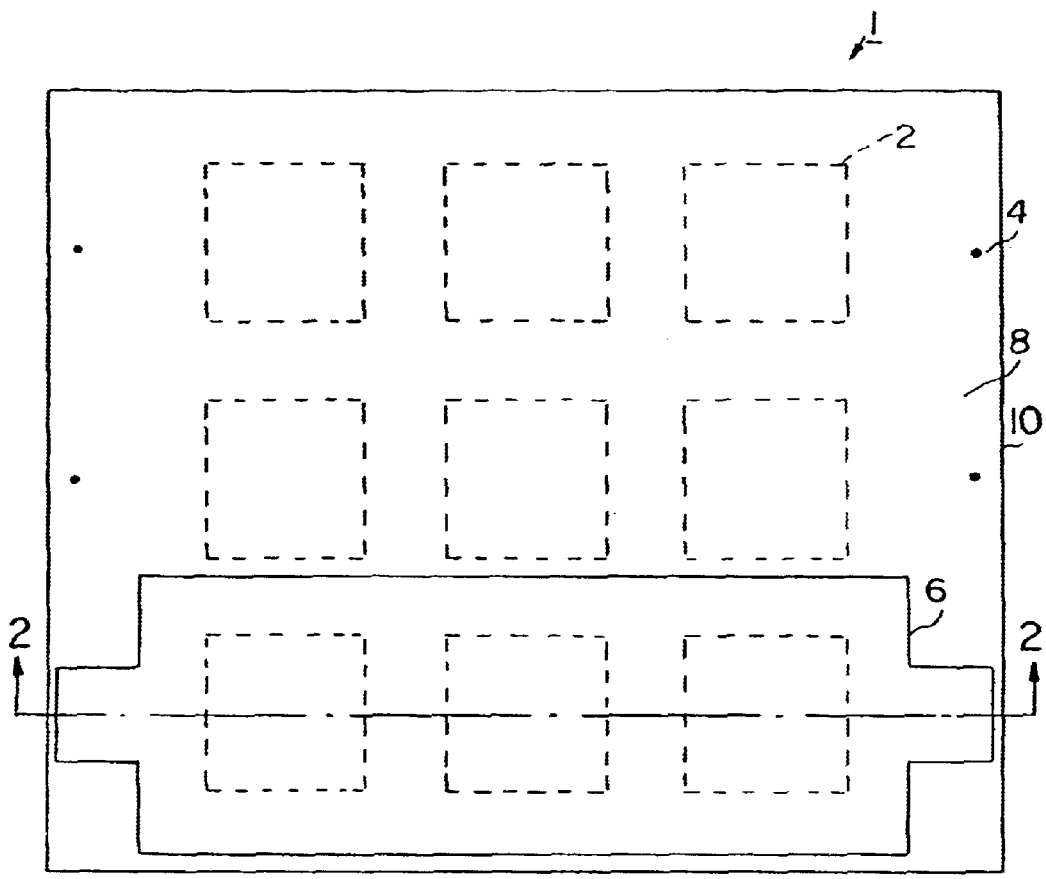
FIG. 1 is a plan view of an exemplary embodiment of the present invention.
Figure 2:
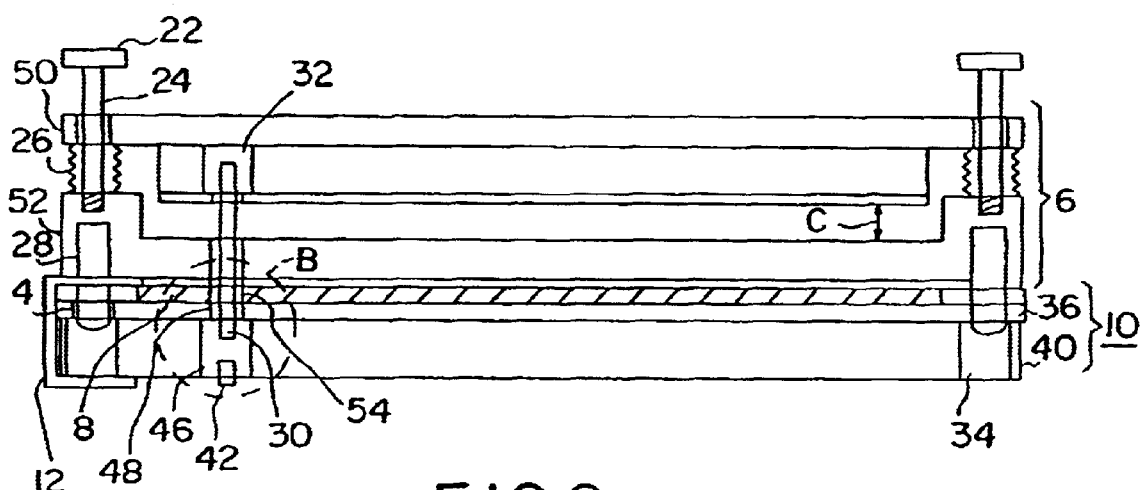
FIG. 2 is a detailed view through section 2—2 of FIG. 1.

Referring to FIG. 1, which is a plan view of an exemplary embodiment of the present invention, and FIG. 2, which is a sectional view through section 2—2 of FIG. 1, a punch apparatus is shown and generally represented by reference numeral 1. In FIG. 1, punch head 6 having a fixed partial punch pattern is disposed above substrate 8. Substrate 8 contains hole pattern 2 dispersed over the surface of substrate 8, for example, nine identical patterns in a 3×3 configuration. In the exemplary embodiment, hole pattern 2 is contained in a rectangular area—although any area configuration may be used. In the exemplary embodiment, the hole pattern is repeated in a 3×3 pattern although any pattern, for example 3×5, 5×5, 10×5, 10×10, 25×25, and other patterns may be used. Substrate 8 is placed on mask die assembly 10 with substrate 8 being detachably fastened to mask die assembly 10. Various means may be used to secure substrate 8 to mask die assembly 10, such as clamps 12 or a vacuum system (not shown), for example, although securement methods are not limited to these means.

As shown in FIG. 2, punch head 6 is aligned with substrate 8 and mask die assembly 10 by aligning pin 28 in punch head 6 with alignment hole 4 in mask die assembly 10. If desired, alignment holes may also be punched through the greensheet as well by using an outrigger (not shown) attached to punch head 6, for example. Once punch head 6 has been aligned with mask die assembly 10 and substrate 8, punch head 6 is moved toward substrate 8 to punch holes in substrate 8. Upon completion of the punching process, punch head 6 is moved away from substrate 8, disengaged from alignment hole 4, and repositioned relative to substrate 8 to punch further holes in substrate 8. The above mentioned process is repeated until the entire surface of substrate 8 has been punched.

Mask die assembly 10 and punch head 6 are created from the via fill mask (not shown) thereby resulting in the elimination of variable location error (misregistration) between punch head 6 and mask die assembly 10.

FIG. 2 is a view through section 2—2 of FIG. 1 of the exemplary embodiment. FIG. 2 details the interrelationships between punch head 6, substrate 8, and mask die assembly 10. Precision mask 36 is placed upon backing plate 40 and, together, these components comprise mask die assembly 10. Precision mask 36 may be fixed to backing plate 40 by any one of various attaching means. Precision mask 36 contains mask holes 48 at the desired locations where vias will be created in substrate 8. Backing plate 40 has openings 46 which correspond to the locations of mask holes 48 but which are slightly larger to allow for ejection of waste slug 42 which results when punch 30 has punched through substrate 8.

Punch head 6 comprises captive nuts 22, spring shafts 24, springs 26, and alignment pin 28 as well as upper punch section 50 and lower punch section 52. Punch 30 is disposed in upper punch section 50 by attaching means 32, for example, cement or other adhesive may be used although other methods and devices may be employed. Punch 30 may be of one size or various sizes depending upon the number and types of holes which are to be punched in substrate 8. Punch 30 may be circular, square, or any configuration necessary to punch the desired holes in substrate 8. Precision mask 36 contains alignment holes 4 which correspond to alignment pins 28 of lower punch head section 52. Alignment pins 28 fit through holes 4 and into bore 34 in backing plate 40.

Once lower punch section 52 is aligned with mask die assembly 10, upper punch section 50 is moved toward substrate 8 and mask die assembly 10 by an external means (not shown). Punch 30 is brought into contact with substrate 8 as clearance "c" is reduced to zero. Punch 30 pierces substrate 8 and aligns with mask hole 48 in precision mask 36 creating via hole 54 in substrate 8 and producing waste slug 42. Upper punch section 50 is then retracted from contact with substrate 8 at which point lower punch section 52 is disengaged from mask die assembly 10. Punch head 6 is then repositioned relative to substrate 8 and mask die assembly 10 to punch further holes in substrate 8.

Punch head 6 is positioned over substrate 8 at a further location for punching an identical pattern of holes and the process of aligning punch head 6 and punching holes in substrate 8 repeats.

Figure 3:
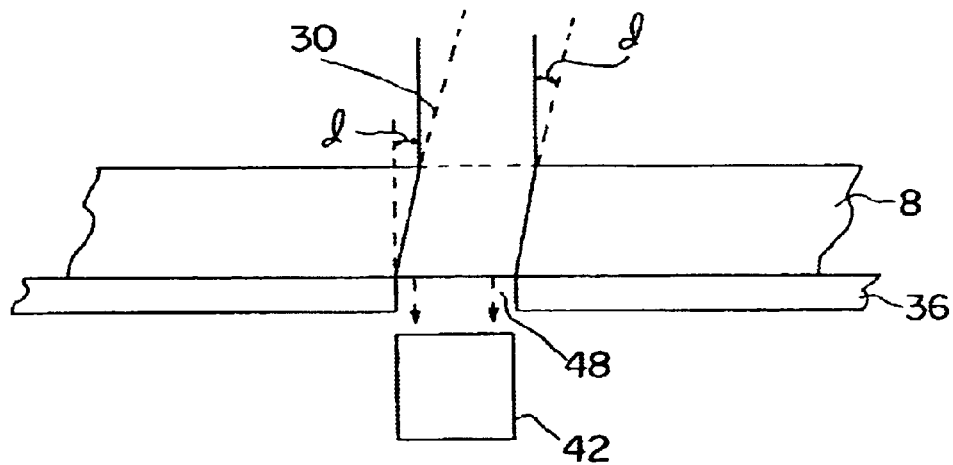
FIG. 3 is a detailed sectional view of area B of FIG. 2 illustrating the articulation of the punch relative to the die and substrate.
Figure 4:
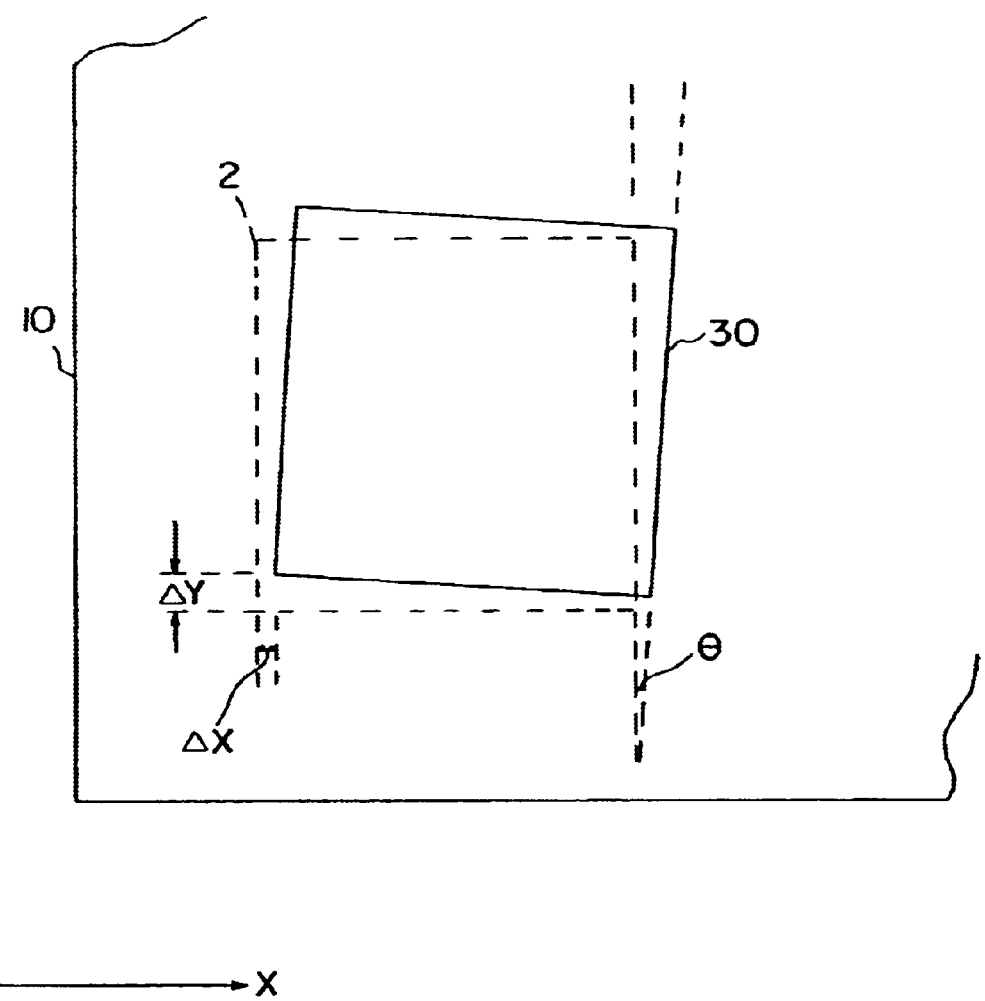
FIG. 4 is a plan view of a portion of the substrate also illustrating the articulation of the punch relative to the die and substrate.
Figure 5:
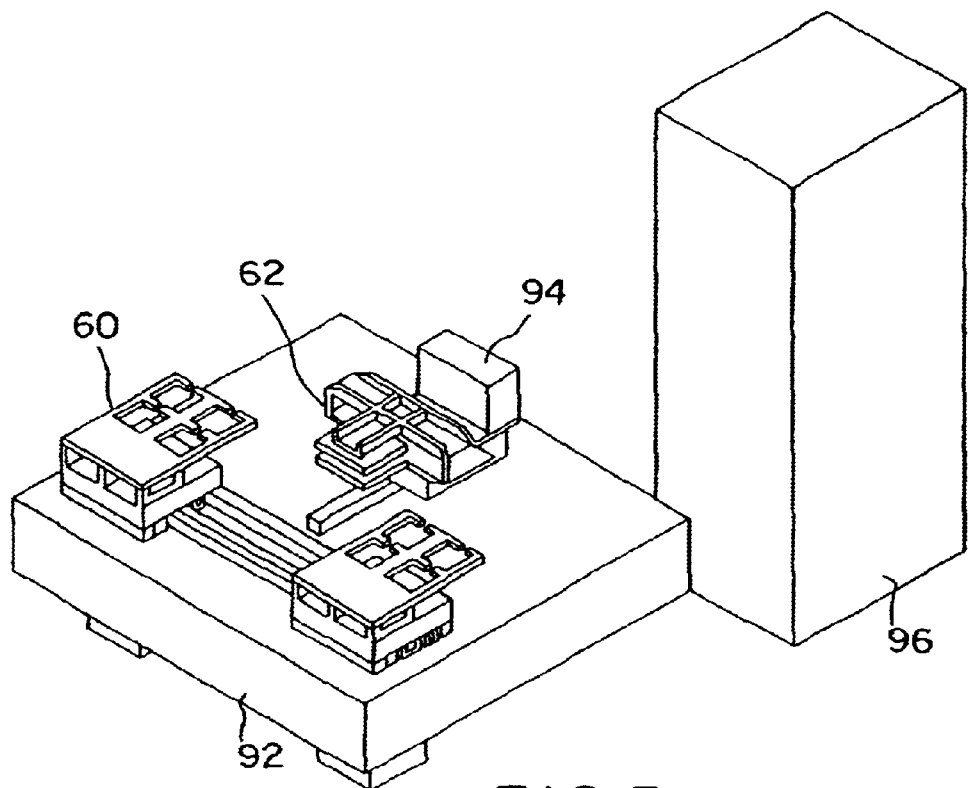
FIG. 5 is a prior art punching system.
Figure 6:
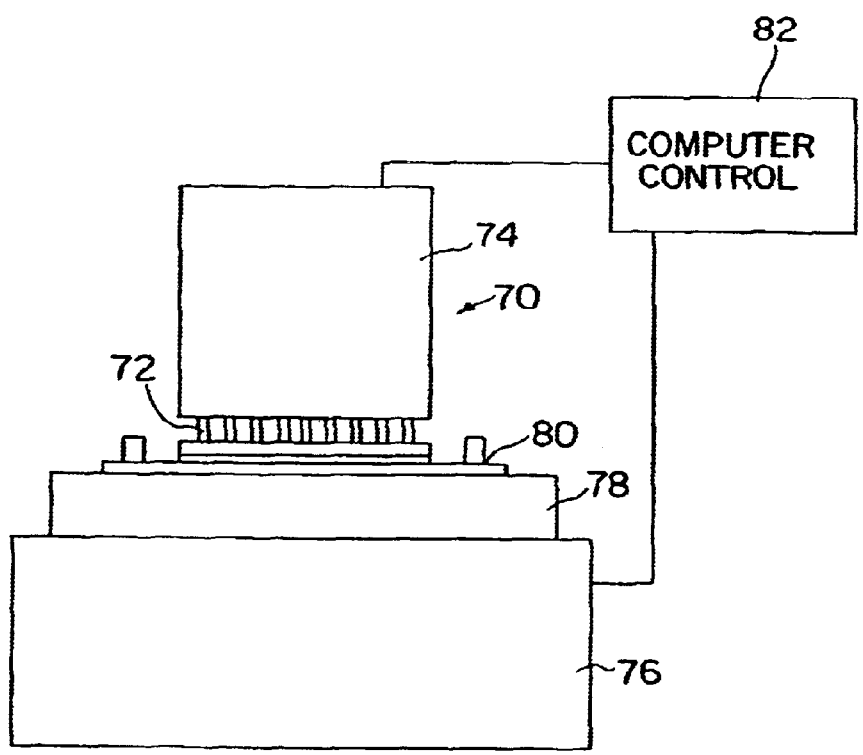
FIG. 6 is another prior art punching system.

FIG. 3 shows a detailed view of area B of FIG. 2. In FIG. 3, punch 30 is shown disposed above substrate 8 and precision mask 36. It is also shown that punch 30 is misaligned with respect to mask hole 48 in precision mask 36 by a distance and/or angle "d". In this case, punch 30 will articulate in the X, Y, or theta directions, as illustrated in FIG. 4, in order to align with mask hole 48 to produce a precision punch via in substrate 8. In FIG. 4, punch head 6 is able to articulate approximately ±0.00381 cm. (±0.0015 in.) in each of the X, Y and theta positions ($\Delta X \leq 0.00381$ cm (0.0015 in.), $\Delta Y \leq 0.00381$ cm (0.0015 in.), and $\Delta \Theta \leq 0.00381$ cm (0.0015 in.)), in order to compensate for any misregistration of punch 30 with respect to precision mask 36, and to thereby align with precision mask 36 and produce precision vias in substrate 8.

Because the via is filled from the die side, the precision of the via is critical on the die side only. Any misregistration, elongation, or the like of the via on the punch side does not affect the precision of the finished product. In addition, because the vias are filled from the die side, the size of the dies and the corresponding punches within an assembly can vary as required.

Although the invention is illustrated and described herein, the invention is not intended to be limited to the details shown. Rather, various modifications may be made in the details within the scope and range of equivalents of the claims and without departing from the invention.

What is claimed:

1. A tool for punching holes in a desired pattern in a substrate comprising:

a die containing a full array hole pattern corresponding to said desired pattern and further having an alignment hole therein;

means for fastening said substrate to said die; and a punch head disposed above said die, having a fixed partial punch pattern for punching holes in said substrate fastened to said die, said fixed partial pattern of said punch head corresponding to only a portion of said full array hole pattern in said die, said punch head further having an alignment pin extending therefrom movably mating with said alignment hole in said die, said alignment hole being sufficiently larger than said alignment pin to permit said punch head to contact a top surface of said substrate and articulate in x-, y-, and theta-directions with respect to said die and said substrate fastened thereto to align said punch head with a corresponding fixed partial hole pattern in said die;

wherein said die includes a die mask for holding said substrate and which contains said full array pattern of a plurality of holes corresponding to said desired array pattern, and wherein said punch head articulates in said x-, y-, and theta-directions to align with a corresponding fixed partial hole pattern in said die mask and create a precision hole pattern in said substrate on a side thereof adjacent said die mask.

2. The tool of claim 1 wherein said means for fastening said substrate to said die comprises a clamp.

3. A tool for punching holes in a desired array pattern in a substrate comprising:

a die having a precision die mask, said die and said die mask each containing a full array pattern of a plurality of holes corresponding to said desired array pattern, said die further having at least one alignment hole therein;

a clamp on said die for detachably fastening said substrate thereto;

a substrate fastened to said die;

a punch head disposed above said die and having a fixed partial punch pattern for punching holes in said substrate fastened to said die, said fixed partial pattern of said punch head corresponding to only a portion of said holes in said die mask, said punch head further having at least one alignment pin extending therefrom movably mating with said at least one alignment hole in said die, said alignment hole being sufficiently larger than said alignment pin to permit said punch head to contact a top surface of said substrate and articulate in x-, y-, and theta-directions with respect to said die mask and said substrate fastened thereto to align said punch head with corresponding holes in said die mask and create a precision hole pattern in said substrate on a side thereof adjacent said die mask, said punch head being repositionable with respect to said die and said substrate fastened thereto to punch additional holes in said substrate corresponding to said fixed pattern until said full array pattern of holes in said die mask is punched.

4. A tool for punching holes in a desired array pattern in a substrate comprising:

a die having a precision die mask, said die and said die mask each containing a full array pattern of a plurality of holes corresponding to said desired array pattern, said die further having at least one alignment hole therein;

a clamp on said die for detachably fastening said substrate thereto;

a substrate fastened to said die;

a punch head disposed above said die and having a fixed partial punch pattern for punching holes in said substrate fastened to said die, said fixed partial pattern of said punch head corresponding to only a portion of said holes in said die mask and being disposed on an upper punch section of said punch head which is spring-mounted to a lower punch section of said punch head, said punch head further having at least one alignment pin extending therefrom movably mating with said at least one alignment hole in said die, said alignment hole being sufficiently larger than said alignment pin to permit said punch head to contact a top surface of said substrate and articulate in x-, y-, and theta-directions with respect to said die mask and said substrate fastened thereto to align said punch head with corresponding holes in said die mask and create a precision hole pattern in said substrate on a side thereof adjacent said die mask, said punch head being repositionable with respect to said die and said substrate fastened thereto to punch additional holes in said substrate corresponding to said fixed pattern until said full array pattern of holes in said die mask is punched.

* * * * *